(12) United States Patent
Li et al.

(10) Patent No.: US 12,349,594 B2
(45) Date of Patent: Jul. 1, 2025

(54) SELF-ADAPTIVE FLEXURAL WAVE ABSORBING SYSTEM AND RELATED METHOD

(71) Applicant: Toyota Motor Engineering & Manufacturing North America, Inc., Plano, TX (US)

(72) Inventors: Xiaopeng Li, Ann Arbor, MI (US); Taehwa Lee, Ann Arbor, MI (US); Hideo Iizuka, Ann Arbor, MI (US); Danil V. Prokhorov, Canton, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 431 days.

(21) Appl. No.: 17/205,426

(22) Filed: Mar. 18, 2021

(65) Prior Publication Data
US 2022/0190231 A1 Jun. 16, 2022

Related U.S. Application Data

(60) Provisional application No. 63/125,542, filed on Dec. 15, 2020.

(51) Int. Cl.
*H10N 30/30* (2023.01)
*H10N 30/88* (2023.01)

(52) U.S. Cl.
CPC ......... *H10N 30/304* (2023.02); *H10N 30/302* (2023.02); *H10N 30/886* (2023.02)

(58) Field of Classification Search
CPC ............... H10N 30/302; H10N 30/304; H10N 30/886

(Continued)

(56) References Cited

U.S. PATENT DOCUMENTS 6,598,717 B1 * 7/2003 Wang ...................... F16F 9/306
                                                         310/326
8,183,746 B2 * 5/2012 Rastegar ............... F42C 11/008
                                                         102/209

(Continued)

FOREIGN PATENT DOCUMENTS

JP       2006207749 A      8/2006
JP       2016109283 A      6/2016

OTHER PUBLICATIONS

Chen et al., "Enhanced flexural wave sensing by adaptive gradient-index metamaterials," Scientific Reports, 6, Article No. 35048, 11 pages (2016).

(Continued)

*Primary Examiner* — Dedei K Hammond
*Assistant Examiner* — Monica Mata
(74) *Attorney, Agent, or Firm* — Christopher G. Darrow; Darrow Mustafa PC (57) ABSTRACT

A system and related method can self-adaptively absorb a flexural wave acting on a beam. The method includes the steps of receiving an input signal representing a frequency response of a flexural wave acting on the beam, determining a spring constant for absorbing the flexural wave based on the input signal, a damping value of a damper acting on the beam, and a mass value of a mass acting on the beam, and applying a spring constant voltage based on the spring constant to a piezoelectric device connected to the beam. The piezoelectric device has a variable spring value that varies based on the voltage applied to the piezoelectric device. The piezoelectric device's variable spring value is approximately equal to the spring constant value when the spring constant voltage is applied to the piezoelectric device.

8 Claims, 7 Drawing Sheets

(58) Field of Classification Search
USPC .......................................................... 310/339
See application file for complete search history.

(56) References Cited

U.S. PATENT DOCUMENTS

| | | | |
|---|---|---|---|
| 2013/0082571 A1* | 4/2013 | Tabata ................... | H02N 2/188 |
| | | | 310/319 |
| 2018/0138886 A1* | 5/2018 | Yoon ................... | H03H 9/02244 |
| 2019/0189898 A1* | 6/2019 | Sieber ................... | H10N 30/857 |
| 2020/0149639 A1* | 5/2020 | Aikawa ................. | F16F 15/007 |

OTHER PUBLICATIONS

Leng, "Controlling flexural waves using subwavelength perfect absorbers: application to Acoustic Black Holes," Le Mans Université, France, Doctoral Thesis by Julien Leng, 145 pages (2019).

Viana et al., "Multimodal vibration damping through piezoelectric patches and optimal resonant shunt circuits," Journal of the Brazilian Society of Mechanical Sciences and Engineering 28, No. 3 (2006): 293-310.

* cited by examiner

SELF-ADAPTIVE FLEXURAL WAVE ABSORBING SYSTEM AND RELATED METHOD

CROSS-REFERENCE TO RELATED APPLICATION

This application claims the benefit of U.S. Provisional Patent Application No. 63/125,542, entitled "SELF-ADAPTIVE FLEXURAL WAVE ABSORBING SYSTEM AND RELATED METHOD," filed Dec. 15, 2020, which is incorporated by reference herein in its entirety.

TECHNICAL FIELD

The subject matter described herein relates, in general, to systems and methods for absorbing flexural waves acting on a mechanical structure, such as a beam.

BACKGROUND

The background description provided is to present the context of the disclosure generally. Work of the inventor, to the extent it may be described in this background section, and aspects of the description that may not otherwise qualify as prior art at the time of filing, are neither expressly nor impliedly admitted as prior art against the present technology.

Some mechanical structures, such as beams, are designed to support lateral loads. In doing so, the displacement is predominantly transverse to the centerline, and internal shear forces and bending moments are generated. This dynamic behavior of beams is called flexural motion in the form of flexural waves.

Flexural waves may deform a structure transversely as the flexural waves propagate. Bending waves are more complicated than compressional or shear waves and depend on material properties and geometric properties. Flexural waves are also dispersive since different frequencies travel at different speeds.

Some current solutions for absorbing flexural waves include the use of dampening materials or nonlinear materials. For example, highly dissipative materials such as polymeric foams or elastomers may be utilized to absorb flexural wave. However, this type of solution either reducing the bending stiffness of the structure subjected to the flexural wave or adding additional amount of mass. This is a one-size-fits-all approach and does not adapt to the presence of flexural waves acting on the mechanical structure. Additionally, this one-size-fits-all approach may only work across a narrow frequency range or high frequency range. Nonetheless, in real-world applications, these methods are still extremely difficult for extending their low frequency wave absorption abilities enough to reach various frequency domains as needed.

SUMMARY

This section generally summarizes the disclosure and is not a comprehensive explanation of its full scope or all its features.

In one embodiment, a self-adaptive flexural wave absorbing system includes a controller, a memory in communication with the controller, a piezoelectric stack electrically connected to the controller, and a tip mass. The piezoelectric stack is configured to be connected to a beam and has a damping value representing the damping of the piezoelectric stack and a variable spring value that varies based on a voltage applied to the piezoelectric stack. The tip mass is in mechanical communication with the piezoelectric stack and has a mass value representing the mass of the tip mass.

The memory has instructions that, when executed by the controller, cause the controller to receive an input signal representing a frequency response of a flexural wave acting on the beam, determine a spring constant value for absorbing the flexural wave based on the input signal, the damping value, and the mass value, and apply a spring constant voltage to the piezoelectric stack based on the spring constant value. The piezoelectric stack's variable spring value is approximately equal to the spring constant value when the spring constant voltage is applied to the piezoelectric stack.

In another embodiment, a self-adaptive flexural wave absorbing system includes a controller and a memory in communication with the controller. The self-adaptive flexural wave absorbing system also includes a beam having a first end and a second end with an extension extending from a main body portion of the beam. A damping material is located on a first side of the extension, while a piezoelectric patch is located on a second side of the extension. The piezoelectric patch is electrically connected to the controller and has a variable spring value that varies based on the voltage applied to the piezoelectric patch.

The memory has instructions that, when executed by the controller, cause the controller to receive an input signal representing a frequency response of a flexural wave acting on the beam, determine a spring constant value for absorbing the flexural wave based on the input signal, a damping value of the damper, and the mass value of the extension, and apply a spring constant voltage to the piezoelectric patch based on the spring constant value. The piezoelectric patch's variable spring value is approximately equal to the spring constant value when the spring constant voltage is applied to the piezoelectric patch.

In yet another embodiment, a method for self-adaptively absorbing a flexural wave acting on a beam includes the steps of receiving an input signal representing a frequency response of a flexural wave acting on the beam, determining a spring constant for absorbing the flexural wave based on the input signal, a damping value of a damper acting on the beam, and a mass value of a mass acting on the beam, and applying a spring constant voltage based on the spring constant to a piezoelectric device connected to the beam. The piezoelectric device has a variable spring value that varies based on the voltage applied to the piezoelectric device. The piezoelectric device's variable spring value is approximately equal to the spring constant value when the spring constant voltage is applied to the piezoelectric device.

Further areas of applicability and various methods of enhancing the disclosed technology will become apparent from the description provided. The description and specific examples in this summary are intended for illustration only and are not intended to limit the scope of the present disclosure.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements, or multiple elements may be designed as one element. In some embodiments, an element shown as an internal component of another element may be implemented as an external component and vice versa. Furthermore, elements may not be drawn to scale.

DETAILED DESCRIPTION

Some mechanical structures, such as beams, are designed to support lateral loads. In doing so, the displacement is predominantly transverse to the centerline, and internal shear forces and bending moments are generated. This dynamic behavior of beams is called flexural motion in the form of flexural waves. The self-adaptive flexural wave absorbing systems and methods described in this specification can absorb flexural waves acting on a beam by using a mass-spring-damper system. However, the spring value of the mass-spring-damper system of the self-adaptive flexural wave absorbing systems and methods described in this specification can vary based on the frequency response of the flexural wave acting on the beam. This is achieved by utilizing a piezoelectric device in the form of a piezoelectric stack and/or piezoelectric patch that essentially acts as a spring in the mass-spring-damper system. Based on the voltage applied to the piezoelectric device, the spring value of the piezoelectric device can vary to better absorb the flexural wave acting on the beam.

Figure 1:
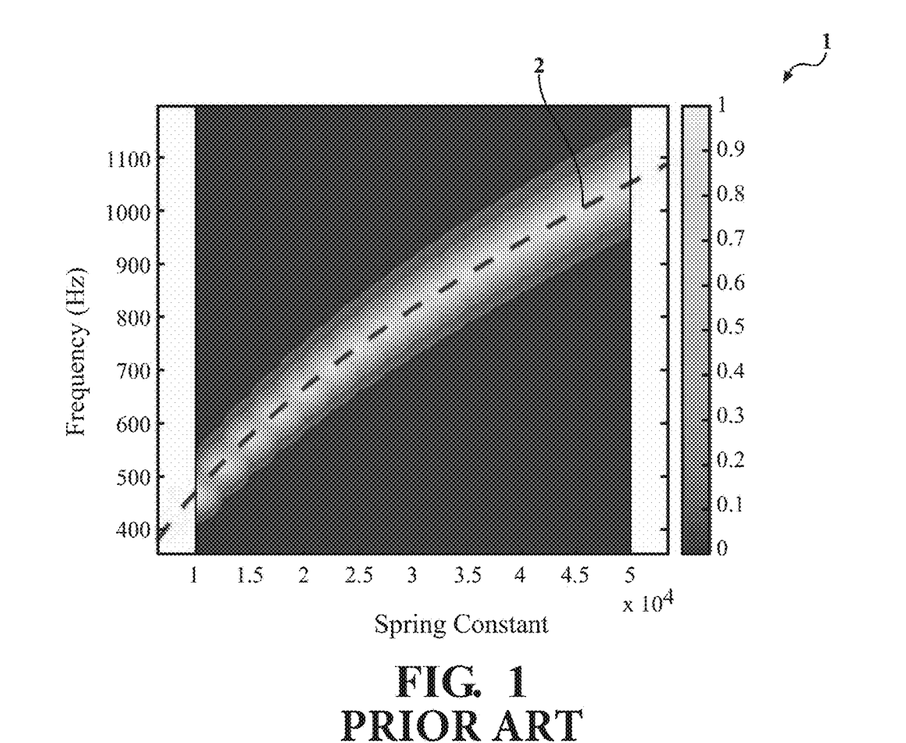
FIG. 1 is a chart illustrating the relationship between a spring constant for a mass-spring-damper system and a frequency of a flexural wave acting on a mechanical structure, such as a beam.

For example, referring to FIG. 1, illustrated is a chart 1 that shows the relationship between the frequency response of a flexural wave acting upon a beam and an appropriate spring constant for absorbing the flexural wave by a mass-spring-damper system. The mass value and the damper value of the mass-spring-damper system may remain constant. However, by adjusting the spring constant 2 appropriately based on the frequency response of the flexural wave, the mass-spring-damper system can absorb the flexural wave.

Figure 2:
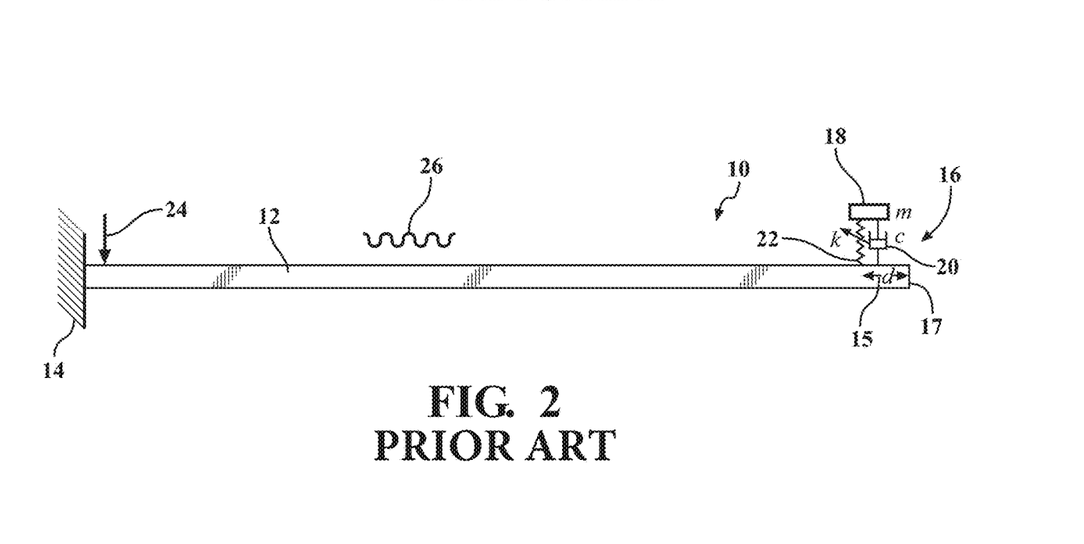
FIG. 2 is a mass-spring-damper system shown to absorb a flexural wave acting on a mechanical structure.

To explain the physics behind the self-adaptive flexural wave absorbing systems and methods described in the specification, reference is made to FIG. 2. Here, FIG. 2 illustrates an example 10 of a mechanical structure in the form of a beam 12 attached, on one end, to a fixed structure 14. It should be understood that this is just but one example to explain the principles of the self-adaptive flexural wave absorbing systems and methods described in the specification. In other examples, the beam 12 may be attached to fixed structures located at both ends of the beam 12 and not just one fixed structure 14 is shown.

Here, the mass-spring-damper system 16 includes a mass 18, a damper 20, and a spring 22 having a spring constant. The mass-spring-damper system 16 may be located at a distance 15 from one end 17 of the beam 12. Here, when a force 24 acts on the beam 12, a flexural wave 26 is generated that acts upon the beam 12. The mass-spring-damper system 16 can absorb the flexural wave 26 acting on the beam 12 by adjusting the spring constant of the spring 22 of the mass-spring-damper system 16. To achieve this, the frequency response of the flexural wave 26 acting on the beam 12 must be known. As will be explained in greater detail in this specification, the self-adaptive flexural wave absorbing systems and methods can determine the frequency response of the flexural wave 26 acting on the beam 12 and adjust the spring constant appropriately to absorb the flexural wave 26 acting on the beam 12.

Figure 3:
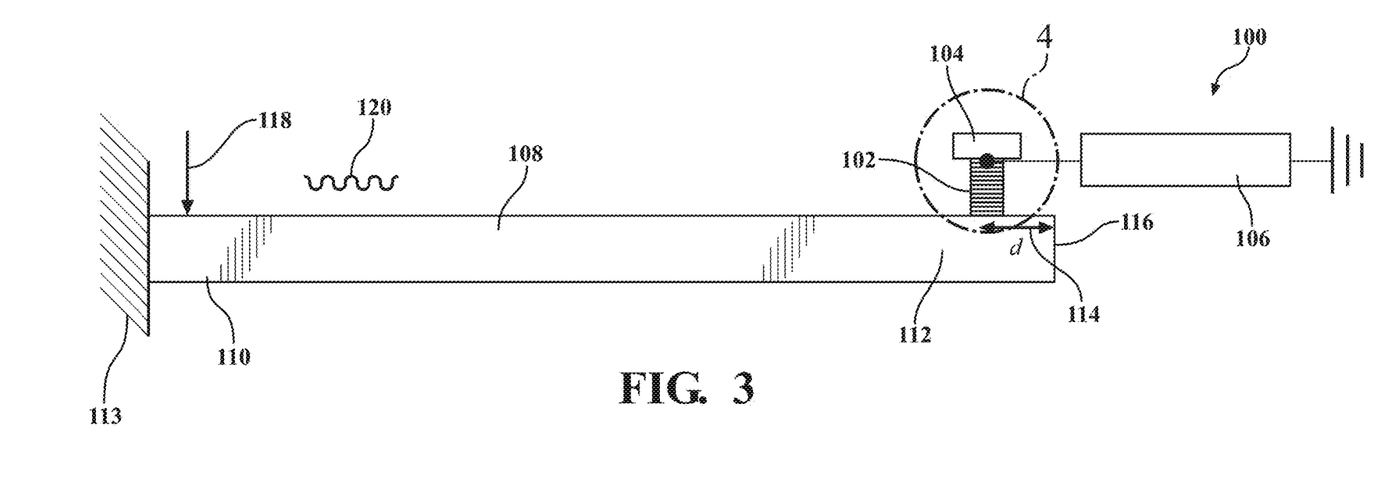
FIG. 3 is one example of a self-adaptive flexural wave absorbing system for absorbing a flexural wave acting on a beam.

Referring to FIG. 3, illustrated is a self-adaptive flexural wave absorbing system 100. The system 100 can absorb flexural waves 120 acting upon a beam 108 that may have been caused by a force 118. The force 118 may be any force capable of causing the flexural wave 120. In one example, the force 118 may be caused by sound waves activating upon the beam 108. In this example, the beam 108 has a first end 110 and a second end 112. The first end 110 is attached to a fixed structure 113, while the second end 112 is a free end. It should be understood that the second end 112 of the beam 108 may not be a free end but could be attached to a fixed structure. As such, both the first end 110 and the second end 112 may be attached fixed structures.

The system 100, in this example, includes a piezoelectric stack 102, a tip mass 104, and a controller 106. The piezoelectric stack 102 is located between the tip mass 104 and the second end 112 of the beam 108. The piezoelectric stack 102 may be at a known distance 114 from the tip 116 of the second end 112 of the beam 108.

Figure 4:
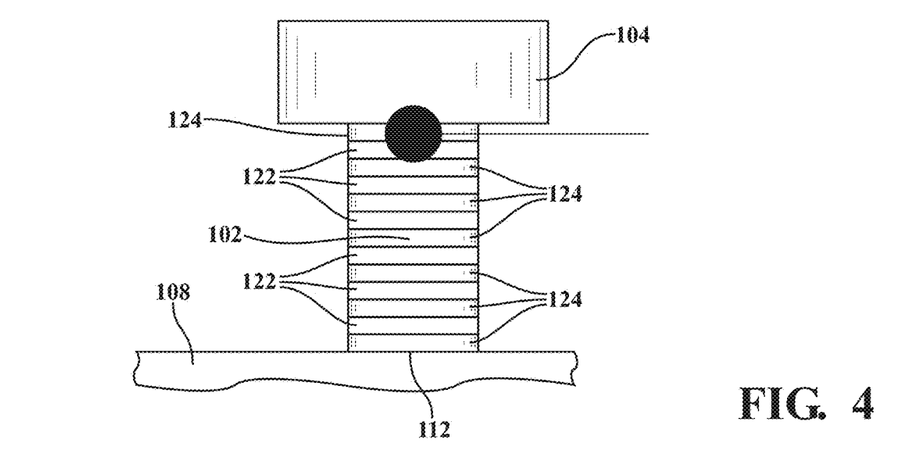
FIG. 4 is a more detailed view of a piezoelectric stack for the self-adaptive flexural wave absorbing system of FIG. 3.

FIG. 4 illustrates a more detailed view of the piezoelectric stack 102. Here, the piezoelectric stack 102 is made of multiple layers. The multiple layers include a plurality of damping layers 122 interlaced between a plurality of piezoelectric patches 124 that may be operating in a d33 mode. The damping layers may be made out of any one of a number of different damping materials, such as silicone, rubber, polyurethane, polyvinyl chloride, combinations thereof, and the like. The damping layers 122 mimic the known damping for a mass-spring-damper system.

The piezoelectric patches 124 are made of materials that exhibit the piezoelectric effect. Here, by applying an appropriate voltage to the piezoelectric patches 124 of the piezoelectric stack 102, the piezoelectric patches 124 may expand or contract—essentially soften or stiffen—thus mimicking a spring for a mass-spring-damper system. As will be explained later, the piezoelectric patches 124 of the piezoelectric stack 102 may also act as sensors sensing the frequency response of the flexural wave 120 acting upon the beam 108. In this example, the controller 106 can determine the frequency response of the flexural wave 120 by measuring the voltage generated by the piezoelectric patches 124 of the piezoelectric stack 102. Using this information, the controller 106 can determine the appropriate spring constant for absorbing the flexural wave 120 and apply an appropriate voltage to the piezoelectric patches 124 to mimic the spring constant necessary for absorbing the flexural wave 120.

Figure 5:
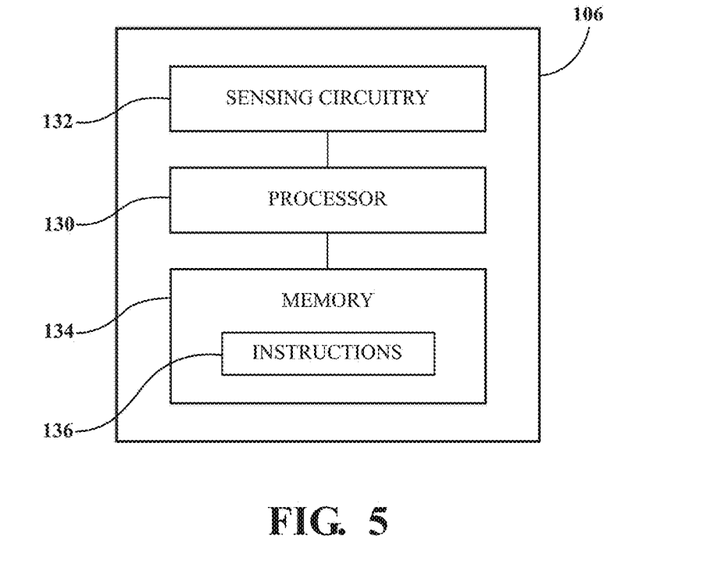
FIG. 5 illustrates one example of a controller for a self-adaptive flexural wave absorbing system.

FIG. 5 illustrates a more detailed view of the controller 106. It should be understood that the controller 106 may be similar to other controllers mentioned in this specification, such as the controllers 206, 306, 406, 506, and 606, which will be described later. Here, the controller 106 includes a processor 130. The processor 130 may be a single processor or may be multiple processors working in concert. The processor 130 is in electrical communication with the sensing circuitry 132 and a memory 134 that has instructions 136. The instructions 136 configure the processor 130 to perform any one of the methodologies described in this specification.

Figure 6A:
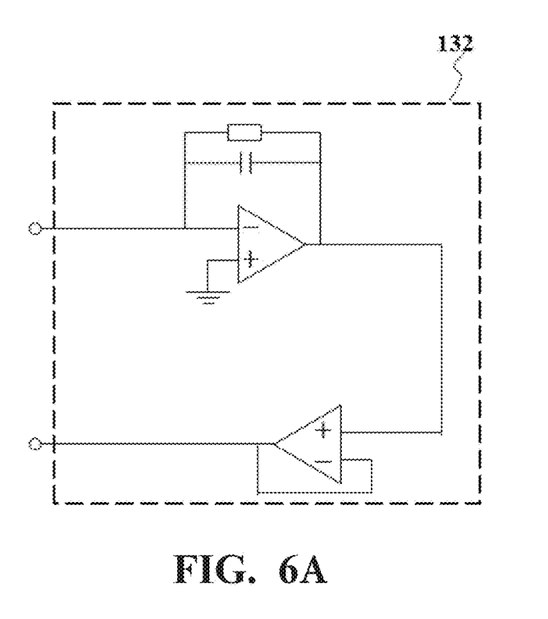
FIG. 6A illustrates a circuit for measuring the frequency response of a flexural wave by a piezoelectric device, such as a piezoelectric stack or a piezoelectric patch.
Figure 6B:
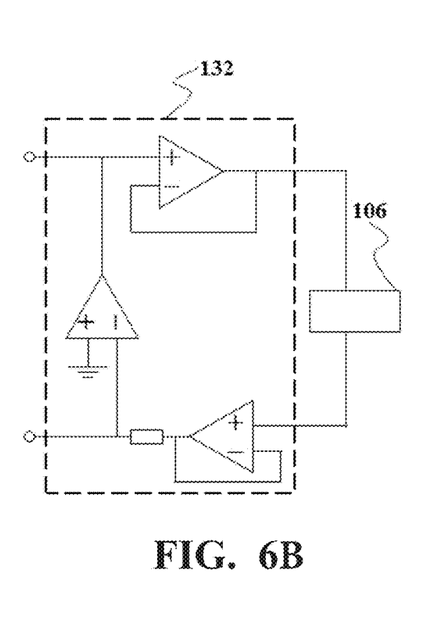
FIG. 6B illustrates a self-sensing and actuating circuitry.

The sensing circuitry 132 can be any appropriate sensing circuit for sensing forces acting upon piezoelectric devices, such as the piezoelectric stack 102 and/or piezoelectric patches. As such, the sensing circuitry 132 can receive information from one or more piezoelectric devices in the form of electrical signals that represent one or more forces acting upon the one or more piezoelectric devices. These forces can include the frequency response of a beam that has a flexural wave acting upon it. One illustration of the sensing circuitry 132 is shown in FIG. 6A. It should be understood that the sensing circuitry 132 can vary from application to application. The illustration shown in FIG. 6A is just but one illustration of sensing circuitry 132 for interpreting electrical signals received from one or more piezoelectric devices that have forces acting upon them. A self-sensing and actuating circuitry is shown in FIG. 6B.

As previously stated, the processor 130 is in communication with a memory 134 that contains the instructions 136. The instructions 136 may cause the processor to perform any one of the methodologies disclosed in this specification. In this example, the instructions 136, when executed by the processor 130, may cause the processor to receive an input signal representing a frequency response of a flexural wave acting on the beam. In one example, the input signal may be provided from the piezoelectric stack 102, which provides a signal to the sensing circuitry 132, which converts this signal to an input signal that can be interpreted by the processor 130.

The instructions 136 can also cause the processor 130 to determine a spring constant value for absorbing the flexural wave 120 based on the input signal from the sensing circuitry 132, the damping value, and the mass value. As stated before, the input signal represents the frequency response of the flexural wave 120 acting upon the beam 108. The damping value may be a damping value associated with the piezoelectric stack 102. The mass value may be associated with mass of the tip mass 104. An appropriate spring constant value can be determined using the input signal, the damping value, and the mass value. The spring constant value can be determined using a number of different methodologies, such as a parameterized formula, a look-up table, an adaptive critic, a reinforcement learning type of control, and a look-up table adaptable by Q-learning.

After the spring constant value has been determined, the instructions 136 cause the processor 130 to apply a spring constant voltage to the piezoelectric stack 102. The spring constant voltage is based on the spring constant value and essentially causes the piezoelectric stack 102 to simulate a spring having a spring value that is approximately equal to spring constant value. Essentially, the system 100 can simulate a mass-spring-damper system that can self adaptively absorb flexural waves across a wide frequency band.

Figure 7:
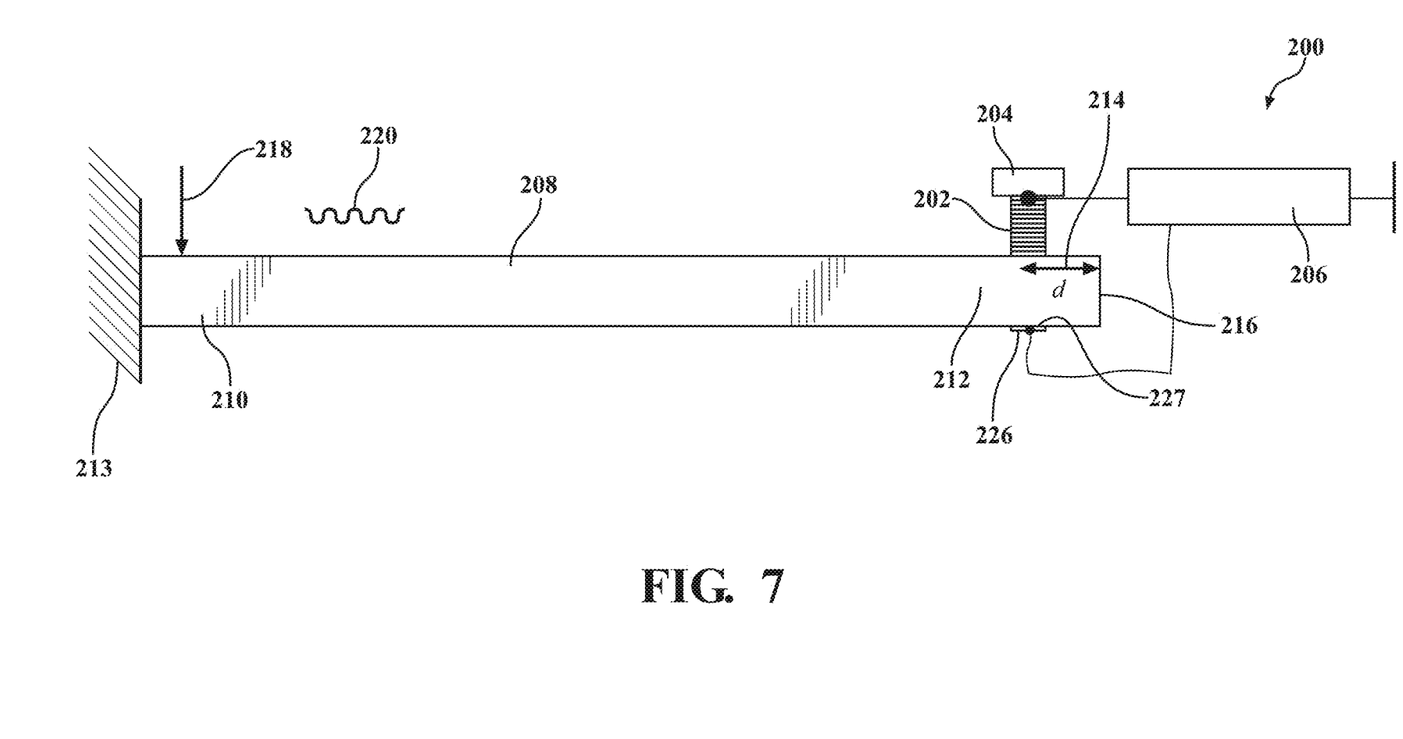
FIG. 7 illustrates another example of a self-adaptive flexural wave absorbing system that includes a piezoelectric patch for detecting the frequency response of a flexural wave.

Referring to FIG. 7, another example of the self-adaptive flexural wave absorbing system 200 is shown. Like reference numerals have been utilized to refer to like elements, with the exception that the reference numerals have been increased by 100. As such, previous descriptions of these elements are equally applicable in this example.

Here, the self-adaptive flexural wave absorbing system 200 is similar to the self-adaptive flexural wave absorbing system 100 of FIG. 3, with the difference that an additional piezoelectric patch 226 is located at the second end 212. The piezoelectric patch 226 may be located on an opposing side 227 of the beam 208—opposite of the piezoelectric stack 202. Here, the purpose of the piezoelectric patch 226 is to act as a sensor for sensing the frequency response of the flexural wave 220 acting upon the beam 208. In this example, instead of utilizing the piezoelectric stack 202 to sense the frequency of the flexural wave 220, the piezoelectric patch 226 performs this sensing function. The sensing of the frequency of the flexural wave 220 may be performed solely by the piezoelectric patch 226 or may be combined with information from the piezoelectric stack 202.

In this example, the controller 206, which is similar to the controller 106 shown in FIG. 5, would have modified instructions to consider information from the piezoelectric patch 226. In this example, the instructions 136, when executed by the processor 130, may cause the processor to receive an input signal representing a frequency response of a flexural wave acting on the beam. In this example, the input signal may be provided from the piezoelectric patch 226, which provides a signal to the sensing circuitry 132, which converts this signal to an input signal that can be interpreted by the processor 130.

Then, like before, the instructions 136 can also cause the processor 130 to determine a spring constant value for absorbing the flexural wave 220 based on the input signal from the sensing circuitry 132, the damping value, and the mass value. The instructions 136 may then cause the processor 130 to apply a spring constant voltage to the piezoelectric stack 202. The spring constant voltage is based on the spring constant value and essentially causes the piezoelectric stack 202 to simulate a spring having a spring value that is approximately equal to spring constant value.

Figure 8:
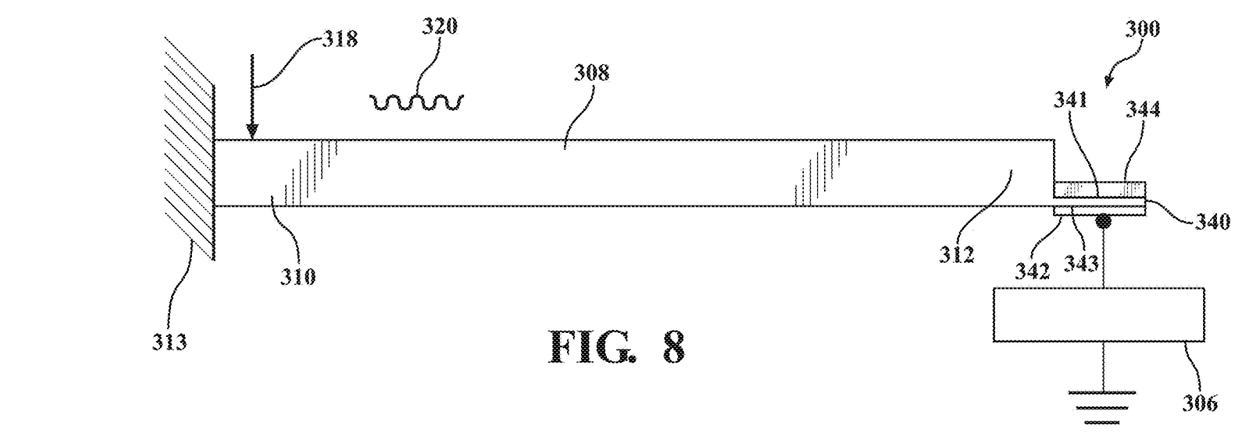
FIG. 8 illustrates another example of a self-adaptive flexural wave absorbing system that includes an extension that extends from a beam.

Referring to FIG. 8, another example of a self-adaptive flexural wave absorbing system 300 is shown. In this example, a beam 308 has a first end 310 attached to a fixed structure 313. The beam 308 has a second end 312 that may be a free end. However, it should be understood that the second end 312 may be attached to a fixed structure. Here, the beam 308 includes an extension 340 that extends from the second end 312 of the beam 308, generally in the direction along the length of the beam 308. The extension 340 generally has a width that is less than the width of the beam 308. The extension 340 and the beam 308 may be a single unitary structure or may be separate pieces that have been joined to each other. The extension 340 has a first side 341 and a second side 343 that are generally opposed to one another. The extension 340 has a mass value associated with it that represents the mass of the extension 340.

Located on the first side 341 of the extension 340 is a damping material 344 that has a damping value associated with it. The damping material 344 may be made of any type of suitable damping material, such as silicone, rubber, polyurethane, polyvinyl chloride, combinations thereof, and the like. Located on the second side 343 of the extension 340 is a piezoelectric patch 342. The piezoelectric patch 342, in this example, is utilized to detect the frequency response of a flexural wave 320 caused by force 318 that is acting upon the beam 308 as well as mimic a spring for a mass-spring-damper system and may be operating in a d31 mode.

A controller 306, which may be similar to the controller 106 of FIG. 5, is in electrical communication with the piezoelectric patch 342. In this example, the controller 306 would have modified instructions. In this example, the instructions 136, when executed by the processor 130, may cause the processor to receive an input signal representing a frequency response of a flexural wave acting on the beam. In this example, the input signal may be provided from the piezoelectric patch 342, which provides a signal to the sensing circuitry 132, which converts this signal to an input signal that can be interpreted by the processor 130.

Then, like before, the instructions 136 can also cause the processor 130 to determine a spring constant value for absorbing the flexural wave 320 based on the input signal from the sensing circuitry 132, the damping value of the damping material 344, and the mass value of the extension 340. The instructions 136 may then cause the processor 130 to apply a spring constant voltage to the piezoelectric patch 342. The spring constant voltage is based on the spring constant value and essentially causes the piezoelectric patch 342 to simulate a spring having a spring value that is approximately equal to spring constant value.

Figure 9:
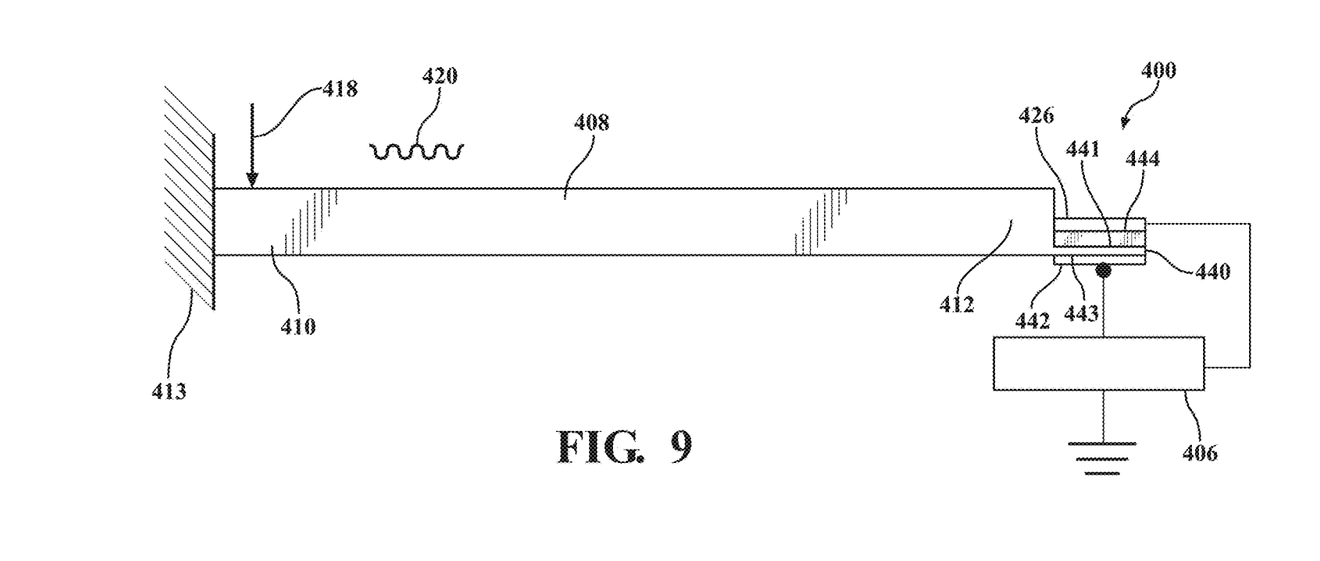
FIG. 9 illustrates an example of the self-adaptive flexural wave absorbing system of FIG. 8 that includes a piezoelectric patch for detecting a frequency response of a flexural wave.

Referring to FIG. 9, another variation of the self-adaptive flexural wave absorbing system 400 is shown. Like reference numerals have been utilized to refer to like elements of FIG. 8, with the exception that the reference numerals have been increased by 100 (e.g. second side 343 is like second side 443). As such, no additional description will be provided for these like elements.

Here, the self-adaptive flexural wave absorbing system 400 also includes a second piezoelectric patch 426 located adjacent to the damping material 444. The second piezoelectric patch 426 may be in direct contact with the damping material 444. Here, the purpose of the second piezoelectric patch 426 is that the second piezoelectric patch 426 is dedicated to measuring the frequency response of the flexural wave 420 acting upon the beam 408. Essentially, in this example, the self-adaptive flexural wave absorbing system 400 utilizes the second piezoelectric patch 426 to determine a frequency acting upon the beam 408 instead of, or in addition to, utilizing the piezoelectric patch 442.

In this example, the controller 406, which is similar to the controller 106 shown in FIG. 5, has instructions that consider information from the second piezoelectric patch 426. In this example, the instructions 136, when executed by the processor 130, may cause the processor to receive an input signal representing a frequency response of a flexural wave acting on the beam. In this example, the input signal may be provided from the second piezoelectric patch 426, which provides a signal to the sensing circuitry 132, which converts this signal to an input signal that can be interpreted by the processor 130.

Then, like before, the instructions 136 can also cause the processor 130 to determine a spring constant value for absorbing the flexural wave 420 based on the input signal from the sensing circuitry 132, the damping value of the damping material 444, and the mass value of the extension 440. The instructions 136 may then cause the processor 130 to apply a spring constant voltage to the piezoelectric patch 442. The spring constant voltage is based on the spring constant value and essentially causes the piezoelectric patch 442 to simulate a spring having a spring value that is approximately equal to spring constant value.

Figure 10:
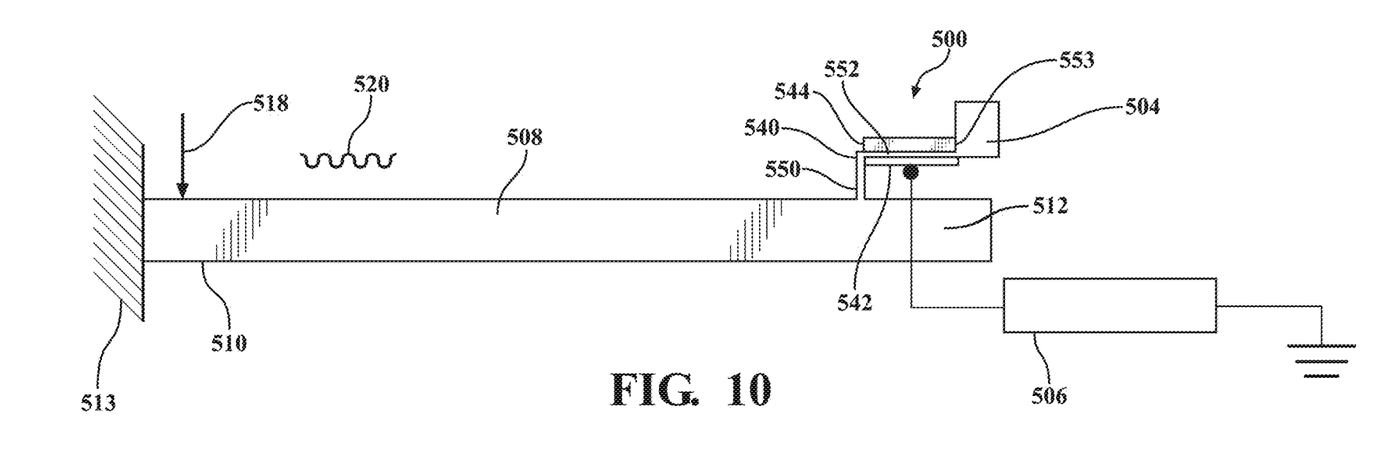
FIG. 10 illustrates another example of a self-adaptive flexural wave absorbing system that includes an L-shaped extension that extends from a beam.

Referring to FIG. 10, another example of a self-adaptive flexural wave absorbing system 500 is shown. Like reference numerals have been utilized to refer to like elements of FIG. 8, with the exception that the reference numerals have been increased by 200. As such, no additional description will be provided for these like elements.

Here, the extension 340 of FIG. 8 has been replaced with an L-shaped extension 540 that extends from the beam 508. Generally, the L-shaped extension 540 is located closer to the second end 512 than the first end 510. Here, the L-shaped extension 540 includes a first part 550 and a second part 552. The first part 550 may extend away from the beam 508 at a direction substantially perpendicular to the length of the beam 508. The second part 552 is connected to the first part 550 but extends in a direction that is substantially perpendicular to the length of the beam 508. Located at an end 553 of the second part 552 is a tip mass 504 that has a mass value representing the mass of the tip mass 504 and the L-shaped extension 540. The tip mass 504 may be located at the end 553 of the second part 552 that is generally opposite to the first part 550.

In this example, the controller 506, which is similar to the controller 106 shown in FIG. 5, would have modified instructions to consider information from the piezoelectric patch 542. In this example, the instructions 136, when executed by the processor 130, may cause the processor to receive an input signal representing a frequency response of a flexural wave acting on the beam. In this example, the input signal may be provided from the piezoelectric patch 542, which provides a signal to the sensing circuitry 132, which converts this signal to an input signal that can be interpreted by the processor 130.

Then, like before, the instructions 136 can also cause the processor 130 to determine a spring constant value for absorbing the flexural wave 520 based on the input signal from the sensing circuitry 132, the damping value of the damper 544, and the mass value of the L-shaped extension 540 that includes the tip mass 504. The instructions 136 may then cause the processor 130 to apply a spring constant voltage to the piezoelectric patch 542. The spring constant voltage is based on the spring constant value and essentially causes the piezoelectric patch 542 to simulate a spring having a spring value that is approximately equal to spring constant value.

Figure 11:
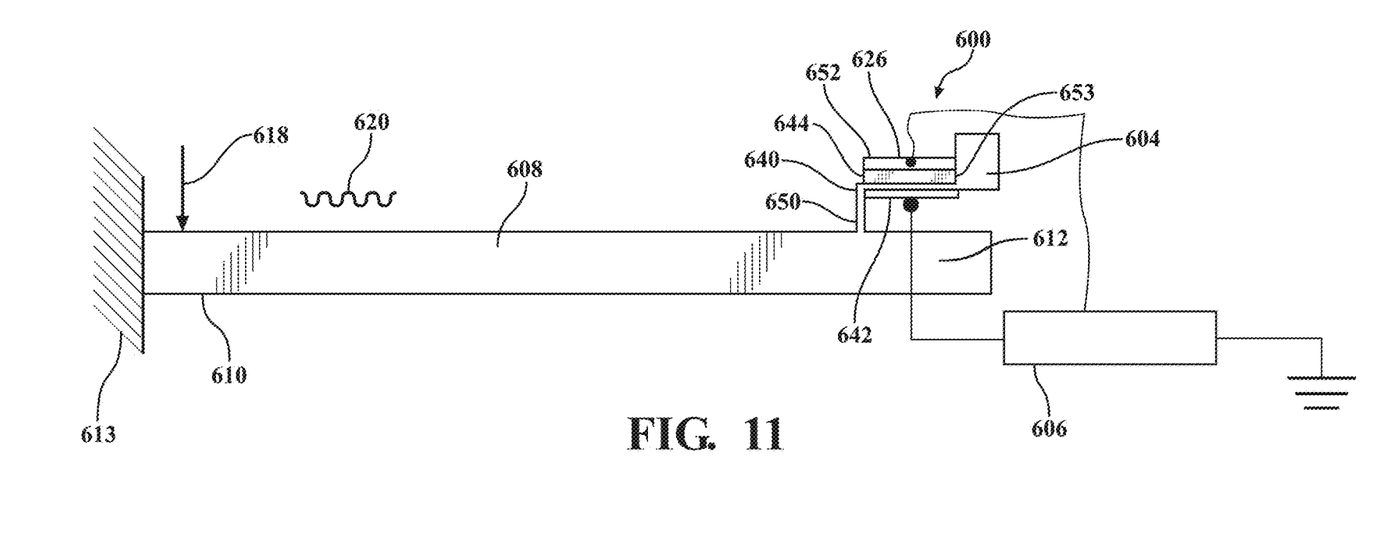
FIG. 11 illustrates another example of the self-adaptive flexural wave absorbing system of FIG. 10 that includes a piezoelectric patch for detecting a frequency response of a flexural wave.

FIG. 11 illustrates a self-adaptive flexural wave absorbing system 600 similar to the self-adaptive flexural wave absorbing system 500 of FIG. 10. Like reference numerals have been utilized to refer to like elements of FIG. 10, with the exception that the reference numerals have been increased by 100 (e.g. second end 512 is like second end 612, first part 550 is like first part 650, second part 552 is like second part 652). As such, no additional description will be provided for these like elements.

The self-adaptive flexural wave absorbing system 600 differs from that of the self-adaptive flexural wave absorbing system 500 of FIG. 10 in that the self-adaptive flexural wave absorbing system 600 includes a second piezoelectric patch 626 located adjacent to the damping material 644. The second piezoelectric patch 626 may be in direct contact with the damping material 644. Here, the purpose of the second piezoelectric patch 426 is that the second piezoelectric patch 626 is dedicated to measuring the frequency response of the flexural wave 620 acting upon the beam 608. Essentially, in this example, the self-adaptive flexural wave absorbing system 600 utilizes the second piezoelectric patch 626 to determine a frequency acting upon the beam 608 instead of, or in addition to, utilizing the piezoelectric patch 642.

In this example, the controller 606, which is similar to the controller 106 shown in FIG. 5, would have modified instructions to consider information from the second piezoelectric patch 626. In this example, the instructions 136, when executed by the processor 130, may cause the processor to receive an input signal representing a frequency response of a flexural wave acting on the beam. In this example, the input signal may be provided from the second piezoelectric patch 626, which provides a signal to the sensing circuitry 132, which converts this signal to an input signal that can be interpreted by the processor 130.

Then, like before, the instructions 136 can also cause the processor 130 to determine a spring constant value for absorbing the flexural wave 420 based on the input signal from the sensing circuitry 132, the damping value of the damping material 644, and the mass value of the extension 640. The instructions 136 may then cause the processor 130 to apply a spring constant voltage to the piezoelectric patch 642. The spring constant voltage is based on the spring constant value and essentially causes the piezoelectric patch 642 to simulate a spring having a spring value that is approximately equal to spring constant value.

Figure 12:
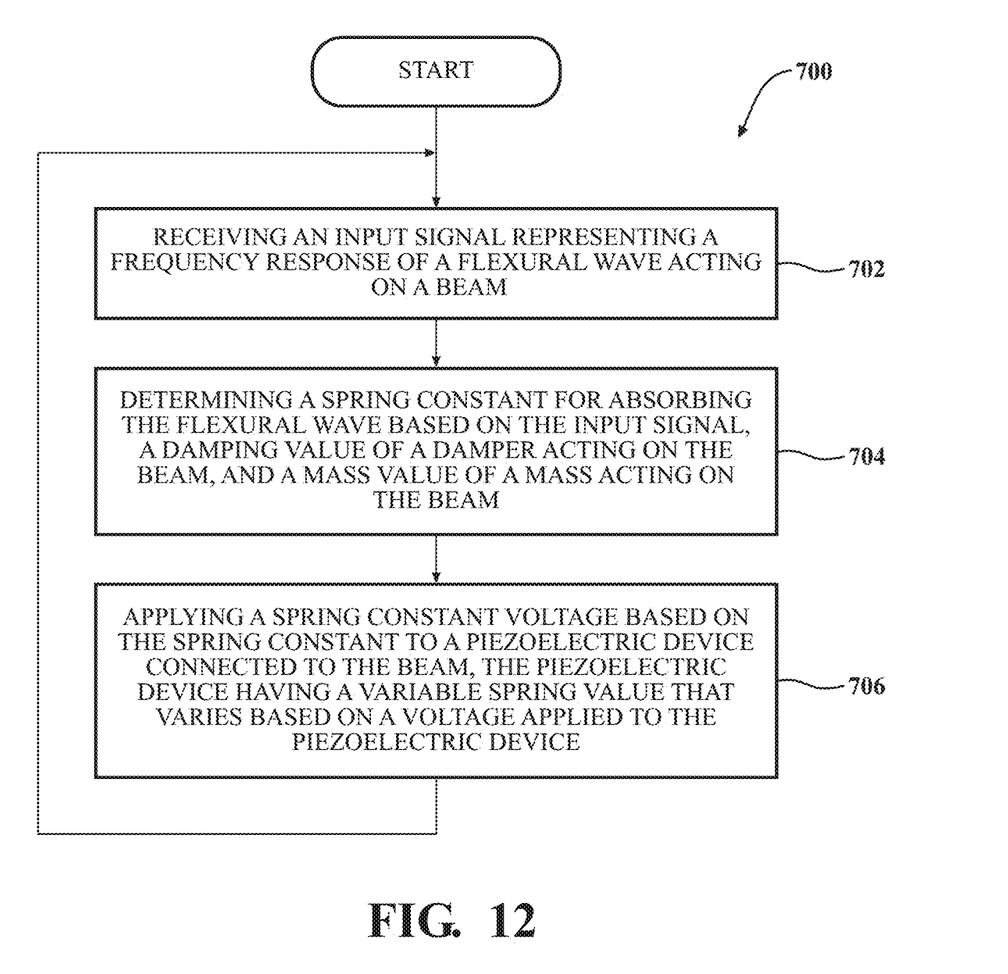
FIG. 12 illustrates a method for self adaptively absorbing flexural waves acting on a mechanical structure.

FIG. 12 illustrates a method 700 for self adaptively absorbing a flexural wave acting on a beam. Here, the method 700 will be described from the viewpoint of the system 100 of FIG. 1 and the controller 106 of FIG. 5. However, it should be understood that this is but one example of implementing the method 700 and that the method 700 is not limited to being implemented within the system 100 or any of the flexural wave self-adaptive absorbing systems described in this specification.

In step 702, the instructions 136, when executed by the processor 130, may cause the processor 130 to receive an input signal representing a frequency response of a flexural wave acting on a beam. In this example, the input signal may be provided from the piezoelectric stack 102, which provides a signal to the sensing circuitry 132, which converts this signal to an input signal that can be interpreted by the processor 130, which provides the signal to the sensing circuitry 132 of the controller 106. The sensing circuitry 132 then converts the signal to an input signal that can be interpreted by the processor 130.

In step 704, the instructions 136, when executed by the processor 130, may cause the processor 130 to determine a spring constant for absorbing the flexural wave based on the input signal, a damping value of a damper acting on the beam, and a mass value of a mass acting on the beam. As stated before, the input signal represents the frequency response of the flexural wave 120 acting upon the beam 108. The damping value may be a damping value associated with the piezoelectric stack 102. The mass value may be associated with the tip mass 104. An appropriate spring constant value can be determined using the input signal, the damping value, and the mass value. The spring constant value can be determined using a number of different methodologies, such as a parameterized formula, a look-up table, an adaptive critic, a reinforcement learning type of control, and a look-up table adaptable by Q-learning.

In step 706, the instructions 136, when executed by the processor 130, may cause the processor 130 to apply a spring constant voltage based on the spring constant to a piezoelectric device connected to the beam. The spring constant voltage is based on the spring constant value and essentially causes the piezoelectric stack 102 to simulate a spring having a spring value that is approximately equal to spring constant value. Essentially, the system 100 can simulate a mass-spring-damper system that can self adaptively absorb flexural waves across a wide frequency band.

It should be appreciated that any of the systems described in this specification can be configured in various arrangements with separate integrated circuits and/or chips. The circuits are connected via connection paths to provide for communicating signals between the separate circuits. While separate integrated circuits are discussed, in various embodiments, the circuits may be integrated into a common integrated circuit board. Additionally, the integrated circuits may be combined into fewer integrated circuits or divided into more integrated circuits.

In another embodiment, the described methods and/or their equivalents may be implemented with computer-executable instructions. Thus, in one embodiment, a non-transitory computer-readable medium is configured with stored computer-executable instructions that, when executed by a machine (e.g., processor, computer, etc.), cause the machine (and/or associated components) to perform the method.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A combination of hardware and software can be a processing system with computer-usable program code that, when being loaded and executed, controls the processing system such that it carries out the methods described herein. The systems, components, and/or processes also can be embedded in a computer-readable storage, such as a computer program product or other data programs storage device, readable by a machine, tangibly embodying a program of instructions executable by the machine to perform methods and processes described herein. These elements can also be embedded in an application product that comprises all the features enabling the implementation of the methods described herein and, when loaded in a processing system, can carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Examples of such a computer-readable medium may include, but are not limited to, a floppy disk, a flexible disk, a hard disk, a magnetic tape, other magnetic medium, an ASIC, a graphics processing unit (GPU), a CD, other optical medium, a RAM, a ROM, a memory chip or card, a memory stick, and other media from which a computer, a processor or other electronic device can read. In the context of this document, a computer-readable storage medium may be any tangible medium that can contain or store a program for use by or in connection with an instruction execution system, apparatus, or device.

The following includes definitions of selected terms employed herein. The definitions include various examples and/or forms of components that fall within the scope of a term and may be used for various implementations. The examples are not intended to be limiting. Both singular and plural forms of terms may be within the definitions.

References to "one embodiment," "an embodiment," "one example," "an example," and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Instructions," as used herein, include routines, programs, objects, components, data structures, and so on that perform tasks or implement data types. In further aspects, a memory generally stores the noted modules. The memory associated with instructions may be a buffer or cache embedded within a processor, a RAM, a ROM, a flash memory, or another suitable electronic storage medium. In still further aspects, instructions, as envisioned by the present disclosure, is implemented as an application-specific integrated circuit (ASIC), a hardware component of a system on a chip (SoC), as a programmable logic array (PLA), as a graphics processing unit (GPU), or as another suitable hardware component that is embedded with a defined configuration set (e.g., instructions) for performing the disclosed functions.

In one or more arrangements, one or more of the instructions described herein can include artificial or computational intelligence elements, e.g., neural network, fuzzy logic, or other machine learning algorithms. Further, in one or more arrangements, one or more of the modules can be distributed among a plurality of the modules described herein. In one or more arrangements, two or more of the modules described herein can be combined into a single module.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . ." as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A system comprising:
a controller;
a piezoelectric stack electrically connected to the controller and having a damping value and a variable spring value that varies based on a voltage applied to the piezoelectric stack, the piezoelectric stack configured to be connected to a beam;
a tip mass connected to the piezoelectric stack and having a mass value, wherein the piezoelectric stack is located between the tip mass and a first side of the beam, the tip mass being adjacent to a free end of the beam;
a sensor disposed on a second side of the beam, opposite of the piezoelectric stack and the tip mass; and
a memory in communication with the controller, the memory having instructions that, when executed by the controller, causes the controller to:

determine a spring constant value for absorbing a flexural wave acting on the beam based on an input signal from the sensor, the damping value, and the mass value, and apply a spring constant voltage to the piezoelectric stack based on the spring constant value, wherein the variable spring value of the piezoelectric stack is approximately equal to the spring constant value when the spring constant voltage is applied to the piezoelectric stack.

2. The system of claim 1, wherein the sensor is a piezoelectric sensor or other type of transducers to measure a mechanical response.

3. The system of claim 1, wherein the piezoelectric stack comprises:
a plurality of piezoelectric patches, and
a plurality of damping layers.

4. The system of claim 3, wherein the plurality of piezoelectric patches are separated from each other by interlacing the plurality of damping layers between each of the plurality of piezoelectric patches.

5. The system of claim 1, wherein the beam has a first end that is opposite of the free end, wherein the first end of the beam is attached to a fixed structure, wherein the piezoelectric stack is located at a distance from the free end.

6. The system of claim 1, wherein the spring constant value is determined using at least one of: a parameterized formula, a look-up table, an adaptive critic, a reinforcement learning type of control, and a look-up table adaptable by Q-learning.

7. A method comprising:
determining a spring constant for absorbing a flexural wave acting on a beam based on an input signal from a sensor representing a frequency response of the flexural wave; and applying a spring constant voltage based on the spring constant to a piezoelectric device connected to the beam, the piezoelectric device being located adjacent to a free end of the beam and between a first side of the beam and a tip mass, the piezoelectric device having a variable spring value that varies based on the spring constant voltage, the sensor disposed on a second side of the beam, opposite of the piezoelectric device and tip mass.

8. The method of claim 7, wherein the piezoelectric device is at least one of a piezoelectric stack and a piezoelectric patch.

* * * * *